United States Patent [19]

Buchan et al.

[11] Patent Number: 5,006,819
[45] Date of Patent: Apr. 9, 1991

[54] TRACK AND HOLD PHASE LOCKED LOOP CIRCUIT

[75] Inventors: William A. Buchan, Corona del Mar; John J. Quintus, Buena Park, both of Calif.

[73] Assignee: Archive Corporation, Costa Mesa, Calif.

[21] Appl. No.: 526,490

[22] Filed: May 21, 1990

[51] Int. Cl.$^5$ ........................ H03L 7/091; H03L 7/099
[52] U.S. Cl. ........................................ 331/1 A; 331/14; 331/27; 328/155; 375/120; 360/51
[58] Field of Search ................... 331/1 A, 14, 1 R, 25, 331/27; 328/155, 151; 375/120; 360/51

[56] References Cited

U.S. PATENT DOCUMENTS

4,358,736 11/1982 De Boer .......................... 328/151 X
4,496,912 1/1985 Wynn .................................. 331/1 A Primary Examiner—Siegfried H. Grimm
Attorney, Agent, or Firm—Roberts and Quiogue

[57] ABSTRACT

A phase locked loop circuit including ramp generating circuitry for generating a dual slope ramp signal having alternating positive and negative slopes that are controlled by the level of the control signal, and sampling circuitry responsive to sample command pulses for providing a sample output representative of the level of the dual ramp signal at the time of sampling. The sample output is provided to a loop which provides the control signal for the ramp generating circuit. Also disclosed is a phase locked loop having ramp generating circuitry for generating a ramp signal, and track and hold circuitry having a plurality of track/hold capacitors that are controlled to track the ramp voltage or hold the ramp signal voltage in response to a sample command signal, such that only a capacitor that is tracking is switched to hold the ramp voltage in response to the sample command signal.

11 Claims, 5 Drawing Sheets

TRACK AND HOLD PHASE LOCKED LOOP CIRCUIT

BACKGROUND OF THE INVENTION

The subject invention generally relates to phase locked loop circuits, and is directed more particularly to track and hold phase locked loop circuitry which includes circuitry for tracking a reference signal and circuitry for holding a sample of the reference to provide for more accurate operation at high sample rates.

Phase locked loop circuits are utilized in data tape drives and disk drives to recover clock information for reading data from the data storage medium. Such clock information is not explicitly written for each bit recorded to tape. Typically, the data bits are written to tape at predetermined data bit intervals with a binary 1 being written to tape pursuant to a transition in the write current level which causes a flux reversal, while a binary 0 is "written" by no transition in the write current level. The technique of representing binary 1's by transitions has been utilized for various known factors including the desire to reduce the number of flux reversals required to write data to tape.

The premise of utilizing the foregoing technique is that data bits are supposed to be written at equally spaced intervals on tape, physically and in time. Thus, data is written to tape by providing appropriate transition/no transition write signals at predetermined intervals. Data is read from tape by timing the output into predetermined intervals and detecting the presence or absence of a transition during each of such intervals. If tape speed were capable of being constant, reading data would be a matter of synchronizing the output to a fixed clock. However, tape speed variations are inevitable, and phase locked loop circuitry is commonly utilized to track tape speed for reading. Simply stated, 1's are readily detected and the problem is to determine the number of any intervening 0's.

In order to provide a phase locked loop having a bandwidth that is independent of the data pattern read from the tape, phase locked loop circuitry having a sample and hold type phase comparator is generally preferred. An example of a PLL having a digital sample and hold type phase comparator is disclosed in commonly assigned U.S. Pat. No. 4,644,420. The digital phase comparator disclosed therein utilizes a voltage controlled oscillator running at 32 times the data rate, in accordance with the generally accepted understanding as to digital phase comparators that the VCO must run at a relatively high multiple of the data rate in order to achieve sufficient accuracy.

A consideration with a digital implementation such as that referenced above is that higher VCO frequencies are needed with increased data rates. For example, at a read clock rate of 9.3 MHz, a VCO center frequency of about 150 MHz would be required, which would be pushing the limits of existing Large Scale Integrated (LSI) circuit technologies.

Known sample and hold type analog phase comparators typically require the sampling of a ramp voltage, and considerations with such analog phase comparators include the time required to discharge the ramp, which reduces the useful timing window since sampled information is not valid during such ramp discharge time. A further consideration is the time required to change the voltage on the sampling capacitor to a new voltage from the previous "hold" voltage, which requires that the sample pulse have a finite width. If the sample time overlaps the ramp discharge time of the ramp, the sample will be indeterminate. Thus, the useful timing window is also reduced by the width of the sample pulse. At higher read clock rates, the timing window reductions produced by the ramp discharge time and the sample time can be significant in comparison to the time domain data bit interval (i.e., the interval for one data bit).

SUMMARY OF THE INVENTION

It would therefore be an advantage to provide a sample and hold type phase locked loop which is not affected by ramp discharge time.

Another advantage would be to provide a sample and hold type phase locked loop which is not affected by the time required to change the sample capacitor voltage from one sample voltage to the next.

The foregoing and other advantages are provided by the invention in a phase locked loop circuit that includes ramp generating circuitry for generating a dual slope ramp signal having alternating positive and negative slopes that are controlled by the level of the control signal, and sampling circuitry responsive to sample command pulses for providing a sample output representative of the level of the dual ramp signal at the time of sampling. The sample output is utilized to provide the control signal for the ramp generating circuit.

A further aspect of the invention is directed to a phase locked loop having ramp generating circuitry for generating a ramp signal, and track and hold circuitry having a plurality of track/hold capacitors that are controlled to track the ramp signal or hold the ramp signal in response to a sample command signal, such that only a capacitor that is tracking is switched to hold the ramp signal in response to the sample command signal.

BRIEF DESCRIPTION OF THE DRAWINGS

The advantages and features of the disclosed invention will readily be appreciated by persons skilled in the art from the following detailed description when read in conjunction with the drawing wherein.

DETAILED DESCRIPTION

In the following detailed description and in the several figures of the drawing, like elements are identified with like reference numerals.

Figure 1:
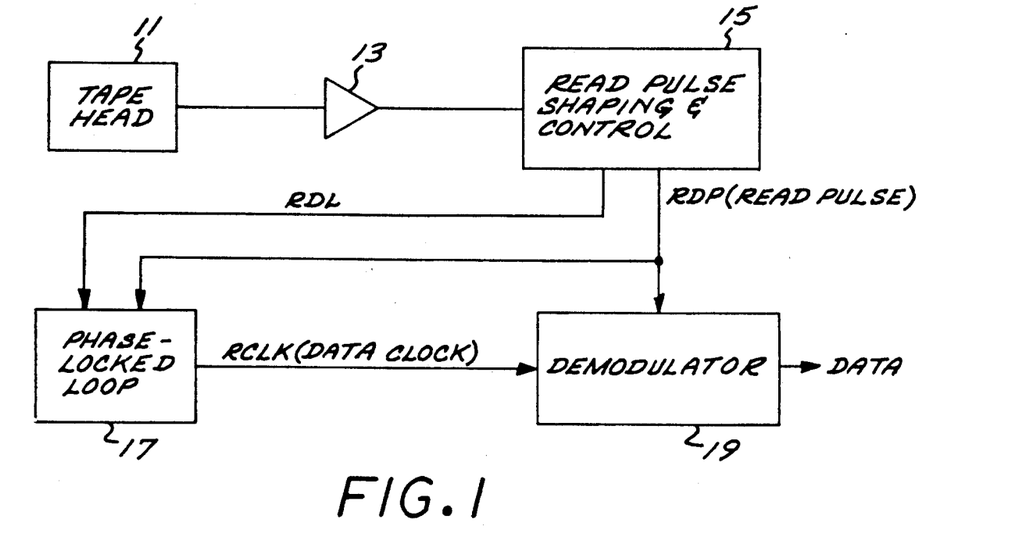
FIG. 1 is a generalized block diagram illustrating the read components of a tape drive in which the disclosed invention can be utilized.

Referring now to FIG. 1, shown therein is a block diagram of a tape read circuit with which the invention can be utilized. A magnetic read head II reads signals from a magnetic tape (not shown). The output of the read head 11 is amplified by a conventional tape head amplifier 13 whose output is provided to a pulse shaping and control circuit 15.

The pulse shaping and control circuit 15 provides a read pulse signal RDP which identifies the occurrences of detection of valid data flux reversals on the magnetic tape which represent binary 1's. In particular, the read pulse signal includes a pulse at each peak of the read voltage that meets appropriate threshold requirements intended to avoid erroneous outputs due to tape "drop outs" and "drop ins". The read pulse signal RDP is produced by known techniques such as zero crossing detection, threshold detection, and time domain filtering.

The read pulse shaping and control circuit 15 further provides a read control signal RDL that changes level pursuant to the leading edge transitions of the read pulse signal RDP. In other words, the read control signal remains at a particular level until the next occurrence of an RDP pulse. For example, the read control signal RDP could be the output of a flip-flop which is toggled by the leading edge transitions of the read pulse signal RDP.

Figure 7:
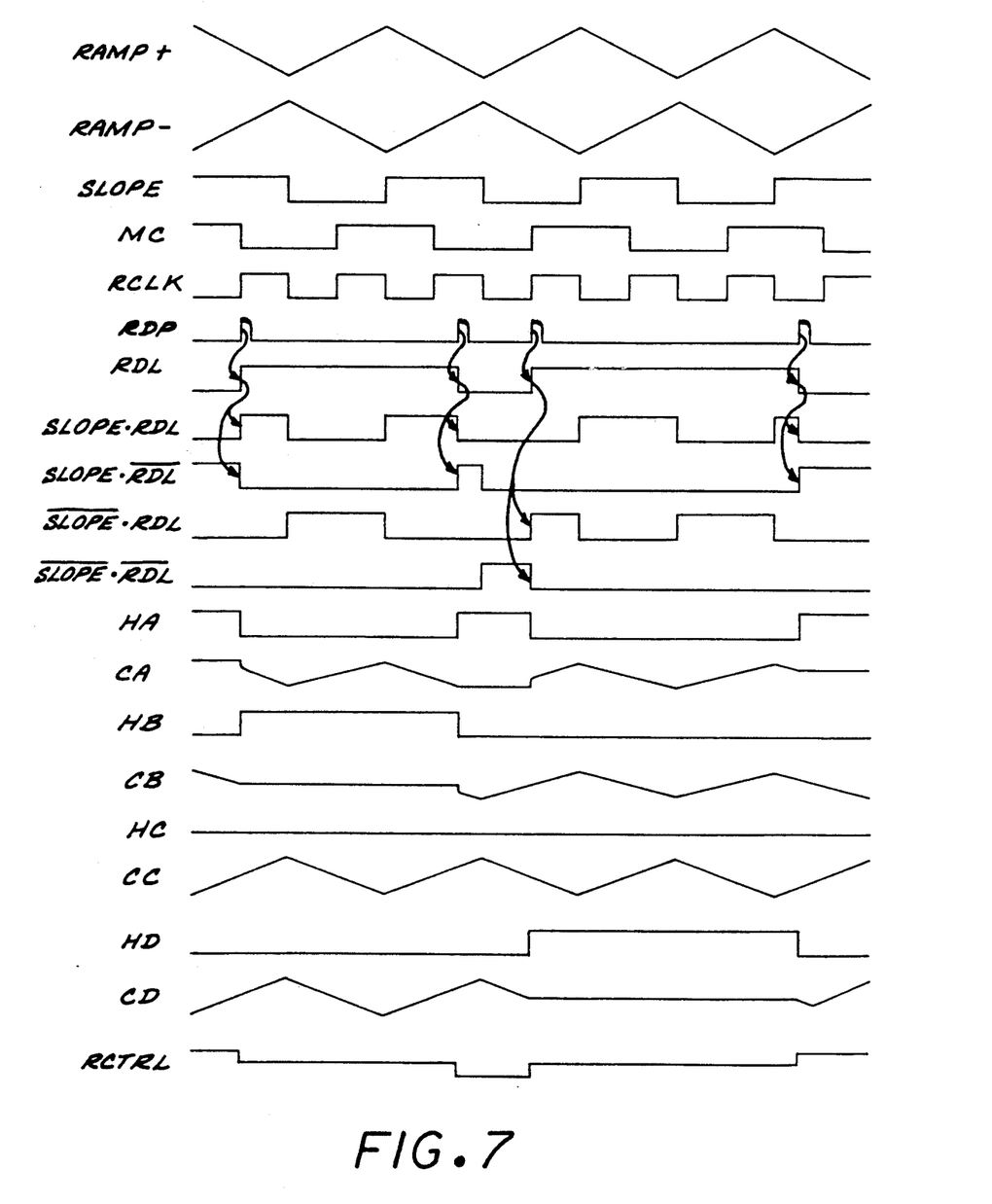
FIG. 7 is a timing diagram schematically depicting the timing of signals utilized in the read circuit of FIG. I and the phase locked loop of FIG. 6.

The timing of the read pulse signal RDP and the read control signal RDL is illustrated in the timing diagram of FIG. 7.

The tape read circuit further includes a phase locked loop (PLL) 17 responsive to either or both the read pulse signal RDP and/or the read control signal RDL. The PLL 17 generates a data clock signal RCLK that is provided to a demodulator 19. Basically, the data clock RCLK is synchronized to the data read from tape as represented by the occurrences of the RDP pulses, and is utilized to produce a tape data output DATA that comprises, for example, data bytes.

Figure 2:
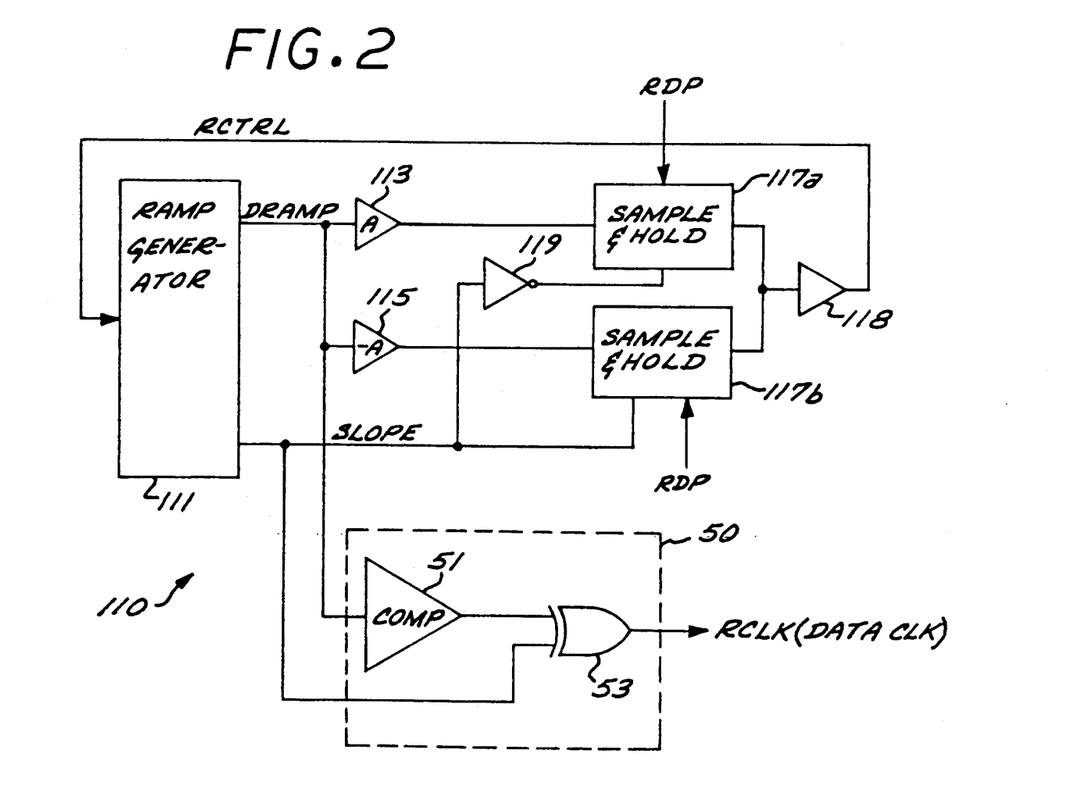
FIG. 2 is a block diagram of an implementation of a dual slope ramp phase lock loop in accordance with the invention.

Referring now to FIG. 2, shown therein is a block diagram of a PLL 110 in accordance with the invention which can be utilized as the PLL 17 in the tape read circuit of FIG. 1. The PLL 110 includes a ramp generator 111 which generates a dual ramp signal DRAMP comprising a series of positive and negative going ramps. The dual ramp signal DRAMP is constrained to reach a predetermined fixed maximum amplitude and a predetermined fixed minimum amplitude. The slopes of the ramp signal are controlled by a ramp control signal RCTRL which is provided by sample and hold circuitry, as discussed further herein. In a quiescent state (i.e., for any fixed level of the ramp control signal RCTRL), the ramp signal is symmetrical about a fixed reference voltage $V_{ref}$ that is centered between the predetermined minimum and maximum ramp amplitudes, and the positive and negative slopes are equal but of opposite sign.

By way of illustrative example, the nominal timing of the dual slope ramp generator 111 is such that the time interval for one ramp corresponds to the nominal time interval for one data bit (i.e., the interval during which a 1 or a 0 can be detected).

The dual slope ramp generator 111 further generates a ramp slope identifying signal SLOPE which is high when DRAMP has a positive slope, and is low when DRAMP has a negative slope. The timing of the slope identifying signal SLOPE is depicted in the timing diagram of FIG. 3.

The DRAMP output of the dual slope ramp generator 111 is provided to a non-inverting buffer amplifier 113 and to an inverting buffer amplifier 115. The non-inverting buffer amplifier 113 and the inverting buffer amplifier 115 are configured so as to provide respective ramp signals RAMP+ and RAMP— that are changing in opposite directions (i.e., while one has a positive slope, the other has a negative slope, and vice versa), which change slopes at substantially the same time. The RAMP+ and RAMP— signals provided by the non-inverting buffer amplifier 113 and the inverting buffer amplifier 115 are depicted in the timing diagram of FIG. 3 for a quiescent time interval during which the ramp slope control signal RCTRL is not changing. Since the ramp signal RAMP+ is substantially similar to the ramp generator output DRAMP, the timing diagram of FIG. 3 also shows the timing relation of the slope identifying signal SLOPE to the various dual slope ramp signals.

It should be noted that the two dual slope ramps generated by the non-inverting and inverting amplifiers of the PLL of FIG. 2 can be produced without the non-inverting buffer amplifier 113. However, depending upon implementation, the dual buffer amplifier implementation may be preferred.

The output of the non-inverting buffer amplifier 113 is provided to a sample and hold circuit 117a, and the output of the inverting buffer amplifier 115 is provided to a sample and hold circuit 117b. The sample and hold circuit 117a is enabled when the negated slope identifying signal SLOPE~ (where ~ indicates negation) as provided by an invertor 119 is low; that is, the sample and hold circuit 117a is enabled when the ramp signal RAMP+ has a positive slope. The sample and hold circuit 117b is enabled when the slope identifying signal SLOPE is low; that is, the sample and hold circuit 117b is enabled when the ramp signal RAMP— has a positive slope. Thus, only the sample and hold circuit associated with a positive going ramp is enabled, and only a positive going ramp is sampled at any given time. The sample control or command pulses for the sample and hold circuits 117a, 117b are provided by the read pulse signal RDP.

The dual slope ramp generator 111 is implemented with conventional techniques, comprising, for example, a first current source that produces a current I and a second current source that produces a current $-2I$. The first current source is fixedly connected to a ramp generating capacitor, while the second current source is switchably connected to the ramp generating capacitor. For the positive going ramp, the second current source is disconnected from the ramp capacitor to provide a ramp capacitor current I. For the negative going ramp, the second current source is connected to the ramp capacitor to provide a ramp capacitor current $(I-2I)$, for a net current of $-I$. The current sources, and therefore the slopes of the ramps, are controlled by the ramp control voltage. The predetermined maximum and minimum amplitudes of the dual slope ramp DRAMP are determined by a comparator having a hysteresis feedback loop and whose output provides the slope identifying signal SLOPE which changes state when the ramp generator output DRAMP changes slope.

The dual slope ramp generator can also be implemented with a square wave generator having a controlled output amplitude and an integrator for integrating the output of the square wave generator. The amplitude of the square wave generator is controlled by the ramp control voltage, which controls the slope of the ramp output of the integrator.

The outputs of the sample and hold circuits 117a, 117b are connected together since only one circuit is enabled at any given time, and the common output is provided to a loop filter 118 which provides frequency shaping. The loop filter 118 can be passive or can be active to provide for additional loop gain that may be required. The output of the loop filter 118 comprises the ramp slope controlling voltage RCTRL provided to the ramp generator 111. The ramp generator 111 is configured to increase the absolute value of the slopes of the ramp signal if the controlling voltage RCTRL is less than the above mentioned fixed reference voltage $V_{ref}$ about which the ramp signal DRAMP is symmetrical. Such increase in the absolute value of the ramp slopes effectively increases the operating frequency of the PLL. If the controlling voltage RCTRL is greater than the fixed reference voltage, the absolute value of the ramp slopes is decreased, effectively decreasing the operating frequency of the PLL.

Figure 3:
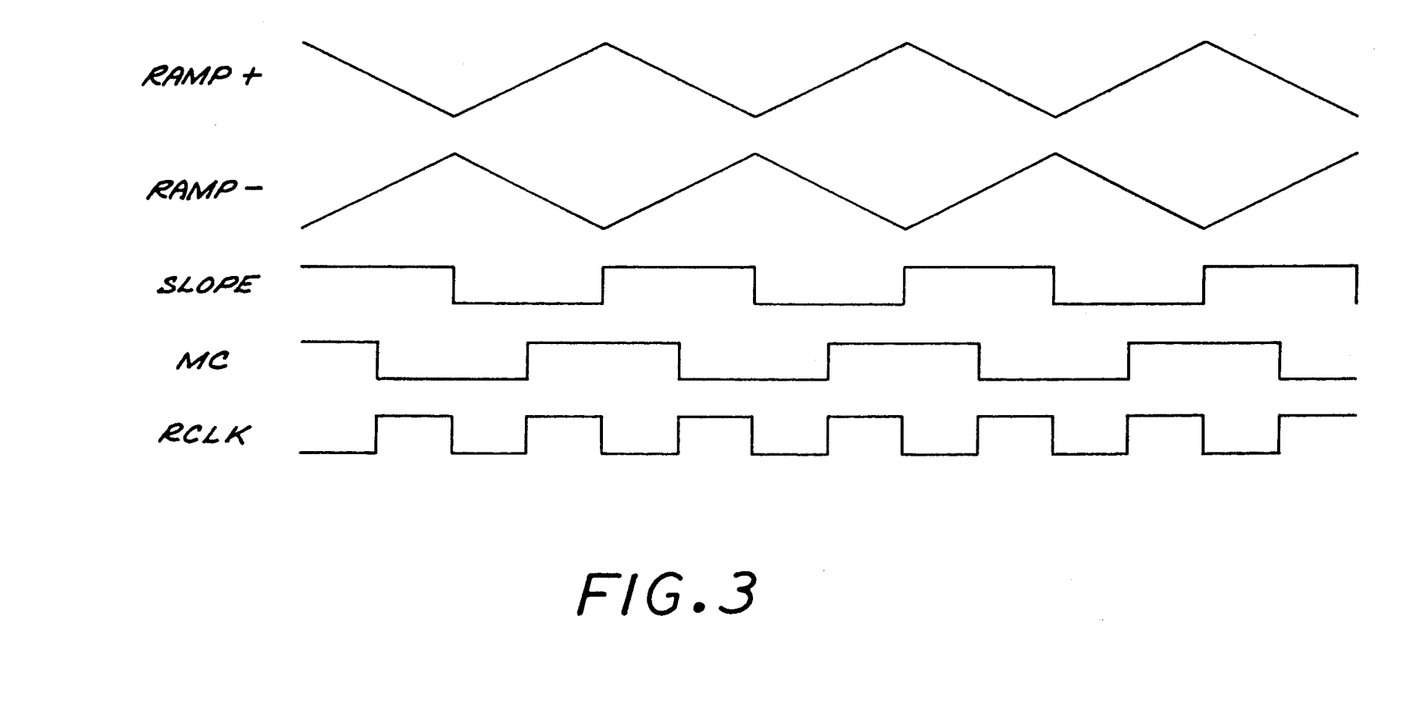
FIG. 3 is a timing diagram schematically depicting the timing of signals in the dual ramp phase locked loop of FIG. 2.

Continuing with FIG. 2, the slope identifying signal SLOPE and the ramp generator output DRAMP are provided to a data timing logic circuit 50 which generates a data clock RCLK. The dual slope ramp signal DRAMP provides an input to a comparator 51 which provides an output MC that depends on whether the ramp signal DRAMP is above or below the reference voltage about which DRAMP is symmetrical. By way of illustrative example, and also referring to FIG. 3 while recognizing that the signal RAMP+ is substantially similar to DRAMP and that the ramp signals in FIG. 3 are based on a quiescent interval during which the ramp slope control signal SLOPE is not changing, MC is high when DRAMP is below such threshold, and is low when DRAMP is above such threshold.

The comparator output MC and the slope identifying signal SLOPE are provided as inputs to an exclusive OR gate 53 which generates the data clock RCLK. Basically, the intervals between transitions of the slope identifying signal SLOPE are data timing intervals or windows, and the comparator 51 and exclusive OR gate 53 cooperate to double the frequency of the SLOPE signal so that one cycle of the data clock corresponds to a data timing interval. Occurrence of an RDP pulse in a data timing interval indicates a 1, while no occurrence of an RDP pulse in a data timing interval indicates a 0.

The PLL of FIG. 2 avoids the problem of a reduced useful timing window caused by ramp discharge time, since the changeover from one ramp signal to another is almost instantaneous.

Figure 4:
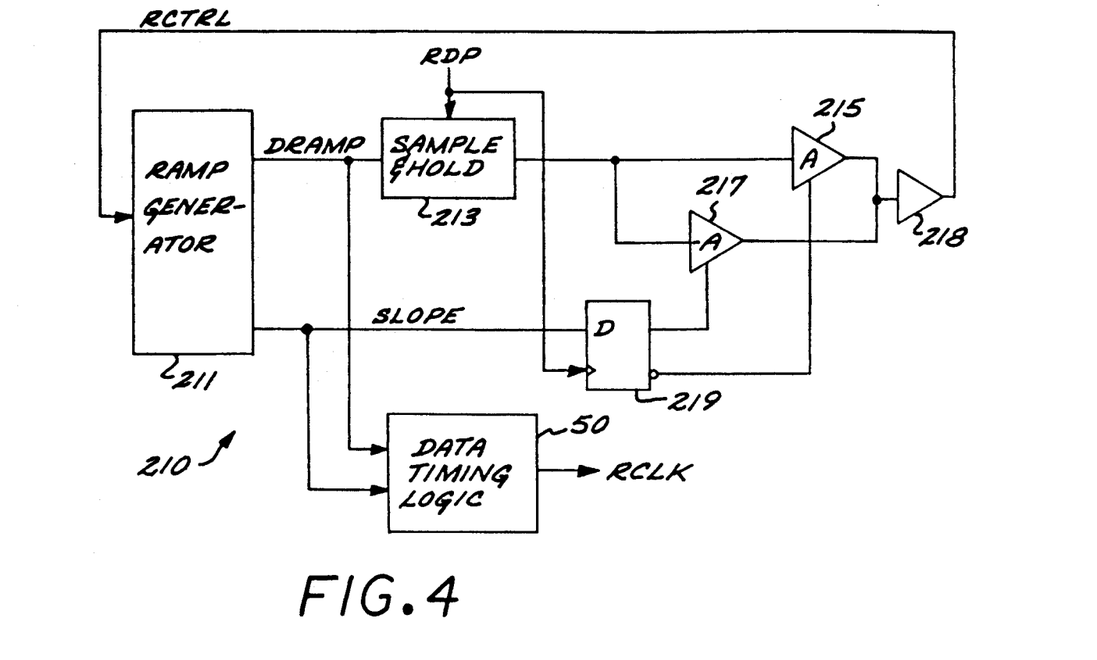
FIG. 4 is a block diagram of a further implementation of a dual slope phase lock loop in accordance with the invention.

Referring now to FIG. 4, shown therein is a further dual slope ramp PLL 210 in accordance with the invention which generates only one dual slope ramp, and appropriately inverts the sampled voltage. The PLL 210 of FIG. 4 includes a ramp generator 211 substantially similar to the ramp generator 111 of FIG. 2, and provides a dual slope ramp output signal DRAMP. The output of the ramp generator is selectively sampled by a sample and hold circuit 213 pursuant to the sample pulses provided by the read pulse signal RDP.

The sample output of the sample and hold circuit 213 is provided to a non-inverting buffer amplifier 215 and to an inverting buffer amplifier 217 which are alternatingly enabled by the outputs of a flip-flop 219 which is clocked by the read pulse signal RDP. The D input of the flip-flop 219 is provided by the slope identifying signal SLOPE from the dual slope ramp generator 211.

In particular, the non-inverting amplifier 215 receives the negative output SW~ of the flip-flop 219, and is enabled when SW~ is high. The inverting amplifier 217 receives the positive output SW of the flip-flop 219, and is enabled when SW is high. Thus, when the slope of the ramp signal is negative at the time a sample is made, the sample output of the sample and hold circuit 213 is inverted so as to provide a sample output having the same sense as a sample taken during a positive going ramp. In other words, the inverted sample would be the same as a sample taken of a positive going ramp. An enabled buffer amplifier remains enabled until the next occurrence of a sample pulse, at which the time the appropriate buffer amplifier is enabled as a function of the slope of the ramp signal DRAMP at such next sample pulse.

The outputs of the non-inverting buffer amplifier 215 and the inverting amplifier 217 are connected together since only one amplifier is enabled at any given time, and the common output is provided to a loop filter 218 which provides frequency shaping. The loop filter 218 can be passive or can be active to provide for additional loop gain that may be required. The output of the loop filter 218 comprises the ramp slope controlling voltage RCTRL provided to the ramp generator 211 The ramp generator 211 is configured similarly to the ramp generator 111 of the PLL in FIG. 2 relative to changing slope in response to the ramp control signal RCTRL.

For the generation of the data clock RCLK, the ramp generator output DRAMP and the slope identifying signal SLOPE are provided to a data timing logic circuit 50, which comprises, for example, a comparator and an exclusive OR gate as shown in FIG. 2 and discussed above relative thereto.

Like the PLL 110 of FIG. 2, the PLL 210 of FIG. 4 avoids dead zones due to ramp discharge time, since the changeover from one amplifier to another is nearly instantaneous.

Figure 5:
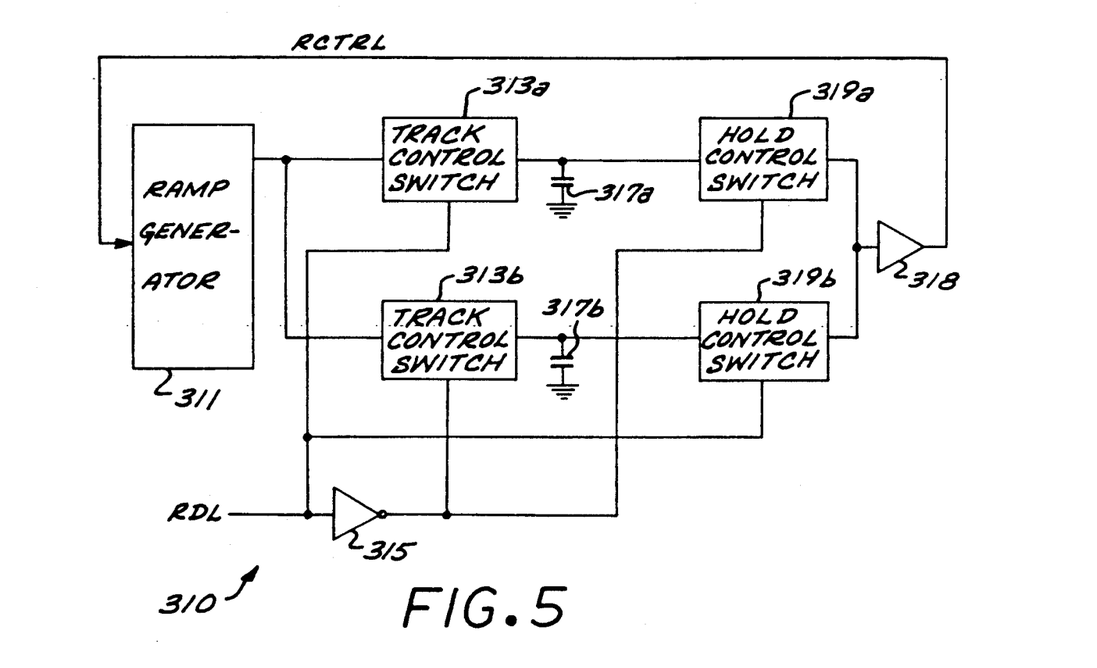
FIG. 5 is a block diagram of a phase locked loop having a track and hold circuit phase comparator.

Referring now to FIG. 5, set forth therein in accordance with the invention is a further PLL 310 which includes a track and hold circuit having two capacitors that alternately provide tracking and holding functions, so as to avoid the dead zones associated with conventional sample and hold circuits. The PLL 310 includes a ramp generator 311 which produces a conventional ramp signal comprising a series of positive going ramps that are quickly discharged to a predetermined minimum level after reaching a predetermined maximum level. The slope of the ramp signal is controlled by a ramp slope control signal RCTRL.

The ramp signal is provided to first and second tracking control switches 313a, 313b which are alternately opened and closed pursuant to the control signal RDL provided by the read pulse shaping and control circuit 15 (FIG. 1). In particular, the first tracking control switch 313a receives the read control signal RDL while the second tracking control switch 313b receives RDL~ via an invertor 315 that is responsive to the read control signal RDL. Thus, at any given time, only one of the tracking control switches is closed while the other is open. The particular control of the switching of the switches will be discussed further herein.

The output of the first tracking control switch 313a is connected to one terminal of a first track/hold capacitor 317a and to the input of a first hold control switch 319a. The other terminal of the first track/hold capacitor 317a is connected to ground. The first hold control switch 319a is controlled by the RDL~ signal provided by the invertor 315.

The output of the second tracking control switch 313b is connected to one terminal of a second track-/hold capacitor 317b and to the input of a second hold control switch 319b. The other terminal of the track-/hold capacitor 313b is connected to ground. The second hold control switch 319b is controlled by the read control signal RDL.

The track and hold circuitry of the PLL of FIG. 5 generally operates as follows. At any given time, only one of the track/hold capacitors is in the hold mode which is determined by the open state of the associated tracking control switch and the closed state of the associated hold control switch. The other track/hold capacitor is in the track mode as set by the closed state of the associated tracking control switch and the closed state of the associated hold control switch. The states of the switches are changed at each transition of the read control signal RDL, and thus, at any given time between transitions, one track/hold capacitor is in the tracking mode for tracking the ramp voltage, while the other track/hold capacitor is in the hold mode for holding the voltage that the ramp signal had at the time the read control signal RDL transitioned from one level to the other. At the next transition of the read control signal, the tracking track/hold capacitor changes to the hold mode for holding the voltage the ramp had at the time of the transition and the holding capacitor changes to the tracking mode for tracking the ramp voltage.

The transitions of the read control signal RDL effectively provide the sample commands, which is appropriate since the transitions of the read control signal RDL are controlled by the RDP pulses.

The outputs of the hold control switches 317a, 317b are connected together, and the common output is provided to a loop filter 318 which provides frequency shaping. The loop filter 318 can be passive or can be active to provide for additional loop gain that may be required. The output of the loop filter 318 comprises the ramp slope controlling voltage RCTRL provided to the ramp generator 311.

While not shown in FIG. 5, the data clock RCLK is readily produced with the PLL shown therein, for example with a comparator that switches when the ramp signal crosses the reference voltage that is between the predetermined minimum and maximum voltages of the ramp signal.

By virtue of the track and hold circuitry, the PLL of FIG. 5 advantageously avoids the reduced useful timing windows associated with conventional sample and hold circuits wherein the charge on a sample capacitor must be rapidly changed from a held sample voltage to a new sample voltage upon each occurrence of a sample pulse.

Figure 6:
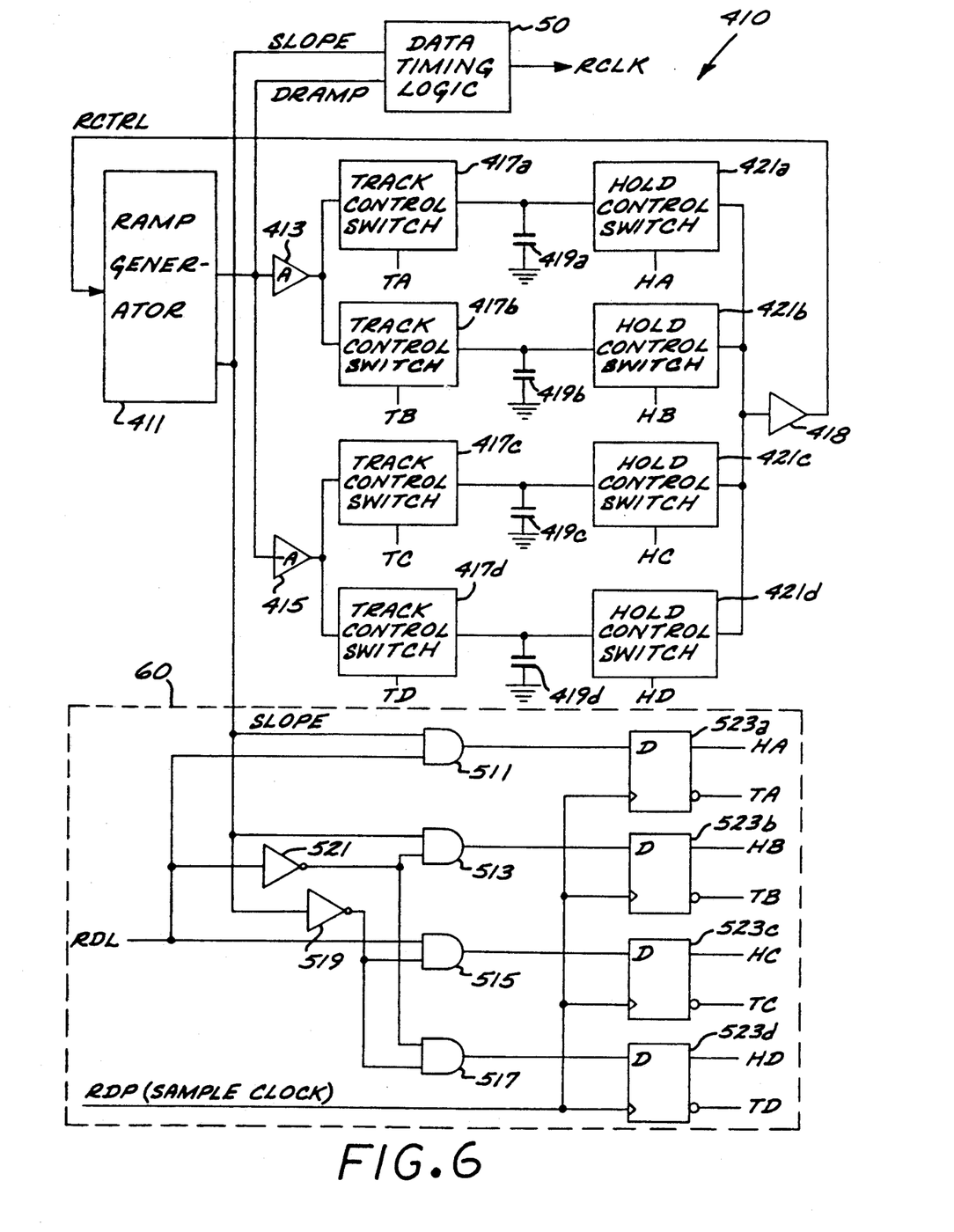
FIG. 6 is a block diagram of a dual slope phase locked loop having a track and hold circuit phase comparator.

Referring now to FIG. 6, schematically shown therein in accordance with the invention is a PLL 410 that utilizes a dual slope ramp as in FIG. 2 and track and hold circuitry as in FIG. 6. The PLL includes a dual slope ramp generator 411 which generates a dual ramp signal DRAMP comprising a series of positive and negative going ramps. The dual ramp signal DRAMP is constrained to reach a predetermined fixed maximum amplitude and a predetermined fixed minimum amplitude. The slopes of the ramp signal are controlled by a ramp control signal RCTRL which is provided by sample and hold circuitry, as discussed further herein. In a quiescent state (i.e., for any fixed level of the ramp control signal RCTRL), the ramp signal is symmetrical about a fixed reference voltage $V_{ref}$, and the positive and negative slopes are equal but of opposite sign.

The dual slope ramp generator 411 further provides a slope identifying signal SLOPE having substantially the same characteristics as the SLOPE signal provided by the dual slope ramp generator in FIG. 2. The function of the slope identifying signal SLOPE for controlling the operation of the PLL is discussed further.

The DRAMP output of the dual ramp generator 411 is provided to a non-inverting buffer amplifier 413 and to an inverting buffer amplifier 415. The non-inverting buffer amplifier 413 and the inverting buffer amplifier 415 have characteristics substantially similar to the non-inverting buffer amplifier 113 and the inverting buffer amplifier 115 described previously relative to the PLL of FIG. 2.

It should be noted that the two dual slope ramps generated by the PLL 410 of FIG. 6 can be produced without the non-inverting buffer amplifier 413. However, depending upon implementation, the dual buffer amplifier implementation may be preferred.

The output of the non-inverting buffer amplifier 413 is a dual slope ramp signal RAMP+ that is provided as inputs to a first pair of tracking control switches 417a, 417b having outputs respectively connected to first terminals of a first pair of track/hold capacitors 419a, 419b which have their other terminals connected to ground. The outputs of the tracking control switches 417a, 417b are further respectively connected as inputs to a first pair of hold control switches 421a, 421b. The first pair of tracking control switches 417a, 417b are respectively controlled by tracking control signals TA, TB, while the first pair of hold control switches 421a, 421b are respectively controlled by hold control signals HA, HB.

The output of the inverting amplifier 415 is a dual slope ramp signal RAMP— that is provided as inputs to a second pair of tracking control switches 417c, 417d having outputs respectively connected to first terminals of a second pair of track/hold capacitors 419c, 419d which have their other terminals connected to ground. The outputs of the second pair of tracking control switches 417c, 417d are further respectively connected as inputs to a second pair of hold control switches 421c, 421d. The second pair of tracking control switches 417c, 417d are respectively controlled by tracking control signals TC, TD; and the second pair of hold control switches 421c, 421d are respectively controlled by hold control signals HC, HD.

The outputs of the hold control switches 421a, 421b, 421c, 421d are connected together, and the common output is provided to a loop filter 418 which provides frequency shaping. The loop filter 418 can be passive or can be active to provide for additional loop gain that may be required. The output of the loop filter 418 comprises the ramp slope controlling voltage RCTRL provided to the ramp generator 411.

The track and hold circuitry of the PLL of FIG. 6 generally operates as follows. At any given time, only one of the track/hold capacitors is in the hold mode which is determined by the open state of the associated tracking control switch and the closed state of the associated hold control switch. The other three capacitors are in the track mode which is set by the closed state of the associated tracking control switch and the open state of the associated hold control switch. Upon the occurrence of an RDP pulse, the hold capacitor becomes a tracking capacitor and one of the tracking capacitors becomes the hold capacitor. The switching of the switches is appropriately controlled so that the capacitor in the hold mode is not selected as the hold capacitor upon the next occurrence of an RDP pulse.

Continuing with FIG. 6, the PLL 410 further includes a switching control circuit 60 for controlling the switching of the tracking control and hold control switches in the PLL of FIG. 7. The slope identifying signal SLOPE from the dual slope ramp generator 411 is provided as inputs to first and second AND gates 511, 513. The complement of the slope identifying signal SLOPE is provided as inputs to third and fourth AND gates 515, 517 via an invertor 519. The read control signal RDL from the read circuit 15 is provided as further inputs to the first AND gate 511 and the third AND gate 515. The complement of the control signal RDL is provided as further inputs to the second AND gate 513 and the fourth AND gate 517 via an invertor 521.

The outputs of the AND gates 511, 513, 515, 517 are respectively provided to the D inputs of first through fourth flip-flops 523a, 523b, 523c, 523d which are clocked by the read pulse signal RDP.

The positive output of the first flip-flop 523a provides the control signal HA for the hold control switch 421a, while the negated output of the first flip-flop 523a provides the control signal TA for the tracking control switch 417a. The positive output of the second flip-flop 523b provides the control signal HB for the hold control switch 421b, while the negated output of the second flip flop 523b provides the control signal TB for the tracking control switch 417b. The positive output of the third flip-flop 523c provides the control signal HC for the hold control switch 421c, while the negated output of the third flip-flop 523c provides the control signal TC for the tracking control switch 417c. The positive output of the fourth flip-flop 523d provides the control signal HD for the hold control switch 421d, while the negated output of the fourth flip-flop 523d provides the control signal TD for the tracking control switch 417d.

The switch control circuit operates as follows to select the hold capacitor. When the slope of the dual ramp signal DRAMP provided by the ramp generator 411 is positive, the candidate capacitor is one of the first pair of track/hold capacitors 417a, 417b. When the slope of the dual ramp signal DRAMP is negative, the candidate capacitor is one of the second pair of track/hold capacitors 417c, 417d. As between the candidates for a given slope of DRAMP, selection depends on the state of the control RDL at the time an RDP pulse occurs. If RDL is high when the RDP pulse occurs, then either the capacitor 417a or the capacitor 417c becomes the hold capacitor, depending on the slope of DRAMP. If RDL is low when the RDP pulse occurs, then either the capacitor 417b or the capacitor 417d becomes the hold capacitor, depending on the slope of DRAMP.

Thus, pursuant to the switching control circuit, the hold capacitor changes with every occurrence of an RDP pulse, even if more than one RDP pulse occurs during a given slope of the dual slope ramp signal DRAMP, since the selection is based on the state of the read control signal RDL which changes state with each RDP pulse.

For the generation of the data clock RCLK, the ramp generator output DRAMP and the slope identifying signal SLOPE are provided to a data timing logic circuit 50, which comprises, for example, a comparator and an exclusive OR gate as shown in FIG. 2 and discussed.

The timing diagram of FIG. 7 schematically illustrates the timing of the ramp signals RAMP+ and RAMP− as provided by the buffer amplifiers in the PLL of FIG. 6, the slope identifying signal SLOPE, the data clock RCLK, the outputs of the AND gates in the switching control circuit, the hold switch control signals provided by the control circuit flip-flops, the voltages CA, CB, CC, CD on the track/hold capacitors for particular illustrated occurrences of RDP pulses and the changes in the read control signal RDL, and the ramp slope control voltage RCTRL. The tracking control signals TA, TB, TC, TD are the respective complements of the associated hold control signals HA, HB, HC, HD. Although small changes in the timing of the RDP read pulses are shown in the timing diagram of FIG. 7, no changes are shown for the ramp signals and the data clock since for the interval shown changes to the ramp signals would be very small. As appreciated by persons skilled in the art, the loop filter of the PLL filters out high frequency variations and amplifies low frequency variations.

As a result of the dual slope ramp and the track and hold circuitry, the PLL of FIG. 6 avoids timing window reductions caused by ramp discharge time and sample pulse width.

While not explicitly shown, it should be appreciated that a further implementation of a dual slope PLL with a track and hold phase comparator can be based upon the dual slope PLL of FIG. 4 and the track and hold phase comparator in FIG. 6.

The foregoing has been a disclosure of techniques for avoiding significant timing window reductions in phase locked loops having sample and hold type phase comparators. Phase locked loops in accordance with the invention are advantageously utilized with higher operating frequencies and in applications where substantial timing window reductions cannot be tolerated. While the foregoing techniques have been disclosed in the context of tape drives, it should be appreciated that such techniques are applicable to other drives that require tracking of media travel speed, such as disk drives.

Although the foregoing has been a description and illustration of specific embodiments of the invention, various modifications and changes thereto can be made by persons skilled in the art without departing from the scope and spirit of the invention as defined by the following claims.

What is claimed is:

1. A phase locked loop comprising:
   ramp signal generating means responsive to a control signal for generating a dual slope ramp signal having alternating first and second slopes of opposite sign that are controlled by the level of the control signal; and
   sampling means responsive to sample control pulses for providing a sampling means output representative of the amplitude of said dual ramp signal at the time of a sample pulse; and
   means responsive to said sampling means output for providing the control signal to said ramp generating means.

2. The phase locked loop of claim 1 wherein said sampling means comprises:
   non-inverting means responsive to said ramp signal for providing a non-inverted replica of said ramp signal;

inverting means responsive to said ramp signal for providing an inverted replica of said ramp signal;

a first sample and hold circuit responsive to the sample control pulses and enabled to sample said non-inverted ramp signal replica when said ramp signal has the first slope; and a second sample and hold circuit responsive to the sample control pulses and enabled to sample said inverted ramp signal replica when said ramp signal has the second slope.

3. The phase locked loop of claim 2 wherein said non-inverting means comprises a non-inverting buffer amplifier, and said inverting means comprises an inverting buffer amplifier.

4. The phase locked loop of claim 1 wherein said sampling means comprises:

a sample and hold circuit responsive to the sample control pulses for providing a sample output representative of the amplitude of said dual ramp signal at the time of a sample pulse;

non-inverting means responsive to said sample output and enabled by the occurrence of a sample pulse while said ramp signal has the first slope for providing said sampling means output, and remaining enabled until the next occurrence of a sample pulse; and inverting means responsive to said sample output and enabled by the occurrence of a sample pulse while said ramp signal has the second slope for inverting said sample output to provide said sampling means output, and remaining enabled until the next occurrence of a sample pulse.

5. The phase locked loop of claim 4 wherein said non-inverting means comprises a non-inverting buffer amplifier, and said inverting means comprises an inverting buffer amplifier.

6. A phase locked loop responsive to sample control pulses indicative of the timing to be tracked by the phase locked loop, comprising:

ramp generating means responsive to a ramp control signal for providing (a) a first dual slope ramp signal having alternating first and second slopes of opposite sign that are controlled by the level of the control signal, and (b) a second dual slope ramp signal comprising an inverted replica of said first dual slope ramp signal;

a first sample and hold circuit responsive to the sample control pulses for (a) sampling said first dual slope ramp signal when said dual slope ramp signal has the first slope, and (b) holding the sample until the next occurrence of a sample control pulse;

a second sample and hold circuit responsive to the sample control pulses for (a) sampling said second dual slope ramp signal when said second dual slope ramp signal has the first slope, and (b) holding the sample until the next occurrence of a sample control pulse; and means responsive to the held samples for providing the ramp control signal.

7. A phase locked loop responsive to a control signal that toggles between first and second states to indicate timing to be tracked by the phase locked loop, comprising:

a ramp generator responsive to a ramp control signal for generating a ramp signal having a slope that is controlled by the level of the ramp control signal;

first track and hold means responsive to the control signal for tracking said ramp signal while the control signal is in the first state, and for holding the amplitude of said ramp signal while the control signal is in the second state, the held amplitude corresponding to the amplitude of said ramp signal at the time of transition of the control signal from the first state to the second state; and second track and hold means responsive to the control signal for tracking said ramp signal while the control signal is in the second state, and for holding the amplitude of said ramp signal while the control signal is in the first state, the held amplitude corresponding to the amplitude of said ramp signal at the time of transition of the control signal from the second state to the first state;

means responsive to said held amplitudes for providing the ramp control signal for said ramp generator.

8. The phase locked loop of claim 7 wherein said first track and hold means comprises:

a first track and hold capacitor;

first track switching means that is closed pursuant to the first state of the control signal for coupling the ramp signal to said first track and hold capacitor to allow said capacitor to track said ramp signal, said first track switching means being open pursuant to the second state of the control signal; and first output switching means that is closed pursuant to the second state of the control signal to allow said first track and hold capacitor to hold the amplitude of said ramp signal at the time of transition of the control signal from the first state to the second state;

and wherein said second track and hold means comprises:

a second track and hold capacitor;

second track switching means that is closed pursuant to the second state of the control signal for selectively providing said ramp signal to said second track and hold capacitor to allow said capacitor to track said ramp signal, said second track switching means being open pursuant to the first state of the control signal; and second output switching means that is closed pursuant to the first state of the control signal for allowing said second track and hold capacitor to hold the amplitude of said ramp signal at the time of transition of the control signal from the second state to the first state.

9. A phase locked loop responsive to sample control pulses indicative of the timing to be tracked by the phase locked loop and a control signal that toggles between first and second states upon the occurrences of sample control pulses, comprising:

ramp generating means responsive to a ramp control signal for providing (a) a first dual slope ramp signal having alternating first and second slopes of opposite sign that are controlled by the level of the control signal, and (b) a second dual slope ramp signal comprising an inverted replica of said first dual slope ramp signal;

first track and hold means responsive to the sample control pulses for (a) tracking said first dual ramp signal, (b) sampling said first dual slope ramp signal upon occurrence of a sample pulse when said first dual slope ramp signal has the first slope, and (c) holding the sample until the next occurrence of a sample pulse;

second track and hold means responsive to the sample control pulses for (a) tracking said second dual slope ramp signal, (b) sampling said second dual slope ramp signal upon occurrence of a sample pulse when said ramp signal has the first slope, and (c) holding the sample until the next occurrence of a sample pulse; and means responsive to the held samples for providing the ramp control signal.

10. The phase locked loop of claim 9 wherein said first track and hold means comprises:

a first track and hold capacitor;

first tracking switching means for selectively providing said first dual slope ramp signal to said first track and hold capacitor;

first hold switching means for selectively outputting the voltage on said first track and hold capacitor;

a second track and hold capacitor;

second tracking switching means for selectively providing said first dual slope ramp signal to said second track and hold capacitor;

second hold switching means for selectively outputting the voltage on said second track and hold capacitor;

said first and second tracking switching means and said first and second hold switching means being controlled so that said first track and hold capacitor holds the amplitude of said first dual slope ramp signal upon the occurrence of a sample pulse when said first dual slope ramp signal has the first slope and the control signal is in a first state, and that said second track and hold capacitor holds the amplitude of said first dual slope ramp signal upon the occurrence of a sample pulse when said first dual slope ramp signal has the first slope and the control signal is in a second state;

and wherein said second track and hold means comprises:

a third track and hold capacitor;

third tracking switching means for selectively providing said second dual slope ramp signal to said third track and hold capacitor;

third hold switching means for selectively outputting the voltage on said third track and hold capacitor;

a fourth track and hold capacitor;

fourth tracking switching means for selectively providing said second dual slope ramp signal to said fourth track and hold capacitor;

fourth hold switching means for selectively outputting the voltage on said fourth track and hold capacitor;

said third and fourth tracking switching means and said third and fourth hold switching means being controlled so that said third track and hold capacitor holds the amplitude of said second dual slope ramp signal upon the occurrence of a sample pulse when said second dual slope ramp signal has the first slope and the control signal is in the first state, and that said fourth track and hold capacitor holds the amplitude of said second dual slope ramp signal upon the occurrence of a sample pulse when said second dual slope ramp signal has the first slope and the control signal is in the second state.

11. A phase locked loop responsive to sample control pulses indicative of the timing to be tracked by the phase locked loop, comprising:

ramp generating means responsive to a ramp control signal for generating a dual slope ramp signal having alternating first and second slopes of opposite sign that are controlled by the level of the control signal;

first track and hold means responsive to sample control pulses for (a) tracking said dual slope ramp signal, (b) sampling said dual slope ramp upon the occurrence of a sample pulse when said dual slope ramp signal has the first slope, and (c) holding the sample output until the next occurrence of a sample pulse;

second track and hold means responsive to the sample control pulses for (a) tracking said dual slope ramp signal, and (b) sampling said dual slope ramp signal upon occurrence of a sample pulse when said dual slope ramp signal has the second slope, and (c) holding the sample output until the next occurrence of a sample pulse; and means responsive to the held samples for providing the ramp control signal.

* * * * *